United States Patent
Chen et al.

(10) Patent No.: US 11,576,283 B2
(45) Date of Patent: Feb. 7, 2023

(54) MODULAR AND HIGHLY AVAILABLE COOLING DISTRIBUTION UNIT FOR INFORMATION HANDLING SYSTEMS

(71) Applicant: Dell Products L.P., Round Rock, TX (US)

(72) Inventors: Yuan Chen, Shanghai (CN); Gemma Hui Chen, Shanghai (CN); Weidong Zuo, Shrewsbury, MA (US); Quanqing Zhu, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/229,624

(22) Filed: Apr. 13, 2021

(65) Prior Publication Data

US 2022/0330459 A1  Oct. 13, 2022

(51) Int. Cl.
*H05K 7/20* (2006.01)

(52) U.S. Cl.
CPC ..... *H05K 7/20627* (2013.01); *H05K 7/20172* (2013.01); *H05K 7/20263* (2013.01); *H05K 7/20272* (2013.01); *H05K 7/20554* (2013.01); *H05K 7/20781* (2013.01)

(58) Field of Classification Search
CPC .......... H05K 7/20536–20836; H05K 7/20627; H05K 7/20172; H05K 7/20263; H05K 7/20272; H05K 7/20554
See application file for complete search history.

(56) References Cited

U.S. PATENT DOCUMENTS

| | | | | |
|---|---|---|---|---|
| 6,714,412 | B1 * | 3/2004 | Chu | H05K 7/2079 165/157 |
| 7,011,143 | B2 * | 3/2006 | Corrado | H05K 7/20645 361/698 |
| 7,050,299 | B2 * | 5/2006 | Kondo | G06F 1/20 361/689 |
| 7,318,322 | B2 * | 1/2008 | Ota | H05K 7/20781 62/305 |
| 7,420,804 | B2 * | 9/2008 | Leija | H05K 7/20772 361/679.48 |
| 8,297,069 | B2 * | 10/2012 | Novotny | H05K 7/2079 62/434 |

(Continued)

FOREIGN PATENT DOCUMENTS

WO  WO-2016069313 A1 *  5/2016  ............ F25B 23/006

*Primary Examiner* — Zachary Pape
(74) *Attorney, Agent, or Firm* — Jackson Walker L.L.P.

(57) ABSTRACT

A highly available and modular cooling distribution unit (CDU) includes a heat exchange module and a pair of redundant pump modules, all configured to occupy a designated rack space that is comparable to rack space required for a conventional 1×CDU without redundancy. The heat exchange module may be fluidically coupled to one or more rack information handling resources via liquid coolant conduits, manifolds and accompanying valves, sensors, etc. In at least one embodiment, the heat exchange module includes a heat exchanger to dissipate heat from a liquid coolant and a fan assembly to move heated air in proximity to the heat exchanger. Each pump module is coupled to the heat exchange module and configured to circulate liquid coolant through a closed loop circuit that includes the heat exchanger, the liquid coolant conduits and manifolds, and information handling resources.

18 Claims, 3 Drawing Sheets

(56) References Cited

U.S. PATENT DOCUMENTS

| | | | |
|---|---|---|---|
| 9,668,382 B2* | 5/2017 | Steinke | H05K 7/20772 |
| 11,310,939 B2* | 4/2022 | Ye | H05K 7/20272 |
| 2018/0027698 A1* | 1/2018 | Cader | H05K 7/20781 |
| | | | 165/80.4 |

* cited by examiner

US 11,576,283 B2

MODULAR AND HIGHLY AVAILABLE COOLING DISTRIBUTION UNIT FOR INFORMATION HANDLING SYSTEMS

TECHNICAL FIELD

The present disclosure relates to information handling systems and, more specifically, liquid cooling distribution units for thermal management of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Semiconductor-based information handling system components, including processors, memory and other solid state storage devices, network switches, chipsets, field programmable gate arrays (FPGAs), and the like, generate heat as they conduct electrical current. Heat generated by an information handling system component can decrease the component's performance and reliability and may result in temporary or permanent failure. Accordingly, thermal management is an important consideration in the design and implementation of many information handling systems.

Air-cooled information handling systems have been well known and widely implemented for decades. Such systems typically employ one or more heat sinks physically and thermally coupled to one or more heat generating components and one or more air movers, i.e., fans, to replace heated air in the vicinity of a heat generating device with cooler air. More recently, the number of information handling systems employing liquid-assisted cooling has increased, particularly in high performance and power-dense environments such as in many data center environments containing an array of server racks populated with rack-based servers, storage, and networking devices.

Liquid cooling solutions, including liquid-to-air cooling distribution units, have been implemented in data centers and other rack server environments to satisfy ever increasing cooling demand resulting from ever increasing thermal energy generated by processing, storage, networking, and other information handling resources. A conventional liquid-to-air cooling distribution unit (CDU) contains multiple active components including one or more pumps, control circuits, valves, fans, and so forth. Failure of any component can cause an entire system to be nonfunctional. In a rack server environment, the loss of a cooling distribution unit for any rack negatively impacts cooling for all servers and storage devices on the rack. Conventional 1+1 redundancy can achieve higher availability, but brings undesirable drawbacks including, without limitation, the additional rack space required to accommodate a redundant CDU, a reduction in the power density of the rack, twice as many external conduits connecting CDUs and manifolds, and roughly double the cost for coolant resources. Off-the-shelf solutions from conventional CDU suppliers frequently have little or no redundant resources and rarely support hot servicing of pumps and other mechanically active components most likely to fail.

SUMMARY

In accordance with teachings disclosed herein, common problems associated with conventional liquid cooling distribution units are addressed, in whole or part, by a modular liquid-to-air cooling distribution unit in which at least some active components, including one or more circulating pumps are implemented with 1+1 redundancy to ensure high availability while one or more passive components, including a heat exchanger, are implemented without redundancy to conserve cost and space. In at least one embodiment suitable for server rack applications, conservation of space is achieved, at least in part, by configuring the modular cooling distribution unit to occupy a designated group of two or more adjacent, 1U rack units within a server rack. In at least one such embodiment, the heat exchange module is configured to occupy a forward portion of the designated rack space while the pair of redundant pump modules are configured to occupy a rearward portion of the designated rack space. In this manner, disclosed modular cooling units achieve availability substantially equivalent to the conventional 1+1 redundant cooling unit configuration illustrated in FIG. 2 with a rack space "footprint" equivalent to the conventional non-redundant cooling distribution unit illustrated in FIG. 1.

In accordance with subject matter included herein, a disclosed modular cooling distribution unit suitable for use within a rack information handling system includes a single heat exchange module and a pair of redundant pump modules all configured to occupy a designated rack space, where the designated rack space is equal or comparable to rack space required for a conventional 1×, i.e., no redundancy, liquid-to-air cooling distribution unit. The heat exchange module may be designed and otherwise configured to occupy a first region of the designated rack space. The heat exchange module may be fluidically coupled to one or more rack information handling resources via liquid coolant conduits, manifolds and accompanying valves, sensors, etc. In at least one embodiment, the heat exchange module includes a heat exchanger to dissipate heat from a liquid coolant and a fan assembly to move heated air in proximity to the heat exchanger.

The modular liquid-to-air cooling distribution unit further includes a pair of redundant pump modules coupled to the heat exchange module and configured to occupy a second region of the designated rack space. The redundant pump modules include a first pump module and a second pump module, each of which is configured to circulate liquid coolant through a closed loop circuit that includes the heat exchanger, the liquid coolant conduits and manifolds, and liquid compatible heat dissipation elements in contact with information handling resources generating significant heat including, but not necessarily limited to processing units including central processing units, graphics processing units, and the like.

The heat exchanger may be configured to: receive high temperature coolant from an inlet manifold fluidically coupled to one or more rack information handling resources, dissipate at least some of the heat within the high temperature coolant to convert the high temperature coolant to a low temperature coolant, and provide the low temperature coolant to an outlet manifold fluidically coupled to the one or more information handling resources. The fan assembly may include a plurality of fans configured to move heated air, generated as the heat exchanger dissipates heat from the high temperature liquid coolant, away from the heat exchanger. The plurality of fans may be configured with N+1 redundancy to provide additional means for maintaining high availability.

Each pump module may be a hot serviceable module that includes a circulating pump, a first liquid coolant conduit connected to a first port of the circulating pump and a second liquid coolant conduit connected to a second port of the circulating pump. The modular cooling distribution unit may employ quick disconnects providing tool-less connections between the pump modules and the heat exchange module. The quick disconnects may include fluidic quick disconnects, which provide tool-less fluidic connections, electrical quick disconnects, providing tool-less electrical connections, or both.

The rack information handling system includes a server rack defining a plurality of 1U rack units and the designated rack space comprises N of the 1U rack units, where N is an integer greater than 1. The heat exchange module may be configured to occupy a forward portion of the designated rack space while each pump module may be configured to occupy one half of a reward portion of the designated rack space. In a vertically arranged configuration, the redundant pump modules are arranged with the first pump module overlying the second pump module. In this configuration, each pump module has a vertical dimension of N/2 rack units. As a non-limiting example, the designated rack space may be a 4U rack space and each of the pump modules may occupy a reward portion of a 2U rack space. In a side-by-side configuration, the redundant pump modules are arranged with the first pump module alongside the second pump module, wherein each of the pump module has a vertical dimension of N 1U rack units. Continuing with the example of a 4U designated rack space, each pump module may comprise a 4U device that is approximately half as wide was the designated rack space.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
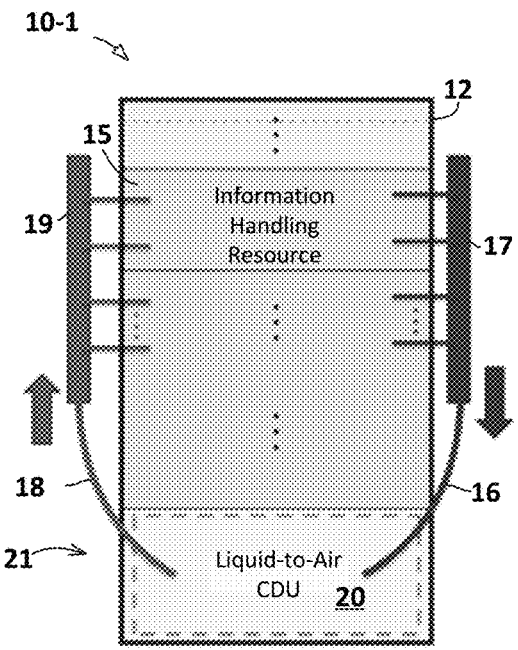
FIG. 1 illustrates a rack information handling system with a single, non-redundant cooling distribution units.

Exemplary embodiments and their advantages are best understood by reference to FIGS. 1-7, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

Additionally, an information handling system may include firmware for controlling and/or communicating with, for example, hard drives, network circuitry, memory devices, I/O devices, and other peripheral devices. For example, the hypervisor and/or other components may comprise firmware. As used in this disclosure, firmware includes software embedded in an information handling system component used to perform predefined tasks. Firmware is commonly stored in non-volatile memory, or memory that does not lose stored data upon the loss of power. In certain embodiments, firmware associated with an information handling system component is stored in non-volatile memory that is accessible to one or more information handling system components. In the same or alternative embodiments, firmware associated with an information handling system component is stored in non-volatile memory that is dedicated to and comprises part of that component.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically. Thus, for example, device "12-1" refers to an instance of a device class, which may be referred to collectively as devices "12" and any one of which may be referred to generically as a device "12".

As used herein, when two or more elements are referred to as "coupled" to one another, such term indicates that such two or more elements are in electronic communication or mechanical communication, including thermal and fluidic communication, as applicable, whether connected indirectly or directly, with or without intervening elements.

Figure 2:
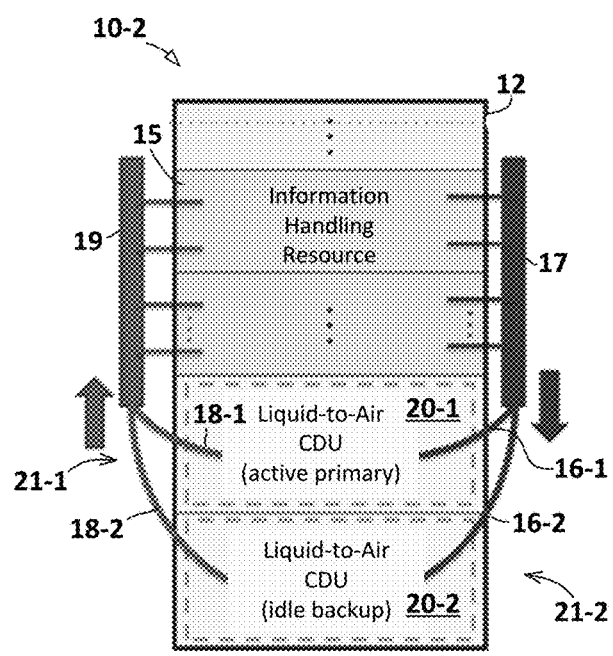
FIG. 2 illustrates a rack information handling system with a pair of redundant cooling distribution units

Referring now to the drawings, FIG. 1 and FIG. 2 illustrate two rack information handling systems, 10-1 and 10-2. As used herein, a rack information handling system refers to a system that includes a server rack housing one or more information handling resources. Both rack information handling systems 10 illustrated in FIG. 1 and FIG. 2 include a server rack 12 housing at least one information handling resource 15 that generates appreciable heat during operation and liquid cooling resources to dissipate heat from and maintain the thermal stability of rack information handling system 10. Information handling resource 15 may be a rack server, storage device, network device, any other suitable resource. The liquid cooling resources illustrated in rack information handling system 10-1 of FIG. 1 include a single, conventional liquid-to-air CDU 20 housed in a designated rack space 21 of server rack 12, an inlet manifold 17 fluidically coupled between information handling resource 15 and liquid-to-air CDU 20 by an inlet coolant conduit 16, and an outlet manifold 19 fluidically coupled between information handling resource 15 and liquid-to-air CDU 20 by an outlet conduit 18. The information handling system 10-2 illustrated in FIG. 2 includes a 1+1 redundant CDU configuration in which two distinct and equivalent CDUs 20-1 and 20-2 are housed in designated rack spaces 21-1 and 21-2 respectively of rack server 12 and fluidically coupled to information handling resource 15 via redundant inlet conduits 16-1 and 16-2 and redundant outlet conduits 18-1 and 18-2. CDUs 20-1 and 20-2 each occupy rack space equivalent to the rack space occupied by CDU 20 in FIG. 1. Accordingly, the redundantly-implemented cooling resources of rack information handling system 10-2 require twice as much rack space as the non-redundant cooling resources of rack information handling system 10-1.

It will be appreciated by those of ordinary skill in the field of information handling system thermal management that first information handling system 10-1 in FIG. 1 is not a highly available system due at least in part to its lack of cooling resource redundancy while second information handling system 10-2 in FIG. 2 may be described as having over-provisioned cooling resources because the pair of CDUs 20 include duplicates of each CDU component, including passive components that are appreciably less likely to fail than pumps, valves, and other active components.

Figure 3:
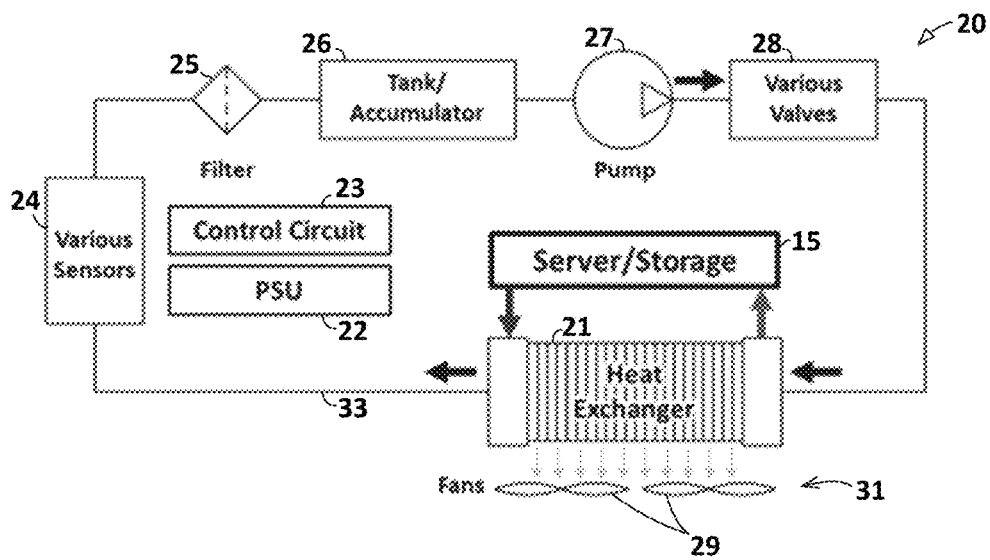
FIG. 3 illustrates a block diagram of selected element of a cooling distribution unit.

Referring now to FIG. 3, components of an exemplary liquid-to-air CDU 20 are depicted. The liquid-to-air CDU 20 illustrated in FIG. 3 includes a heat exchanger 21 thermally coupled to one or more information handling resources 15, only one of which is illustrated in FIG. 3. A fan assembly 31 includes one or more fans 29 configured to move heated air in proximity to heat exchanger 21 away from heat exchanger 21. Liquid coolant is circulated through a closed loop 33 that includes various sensors 24, one or more filters 25, a tank/accumulator 26, one or more pumps 27 and various valves 28. The CDU 20 illustrated in FIG. 3 further includes a control circuit 23 configured to manage and control the illustrated components in accordance with information provided via sensors to maintain thermal stability and a desirable temperature for information handling resources 15. Although the CDU 20 illustrated in FIG. 3 includes a specific set of components configured in a specific arrangement, it will be appreciated by those of ordinary skill in the field that liquid-to-air CDUs may include more, fewer, or different components in other embodiments.

Figure 4:
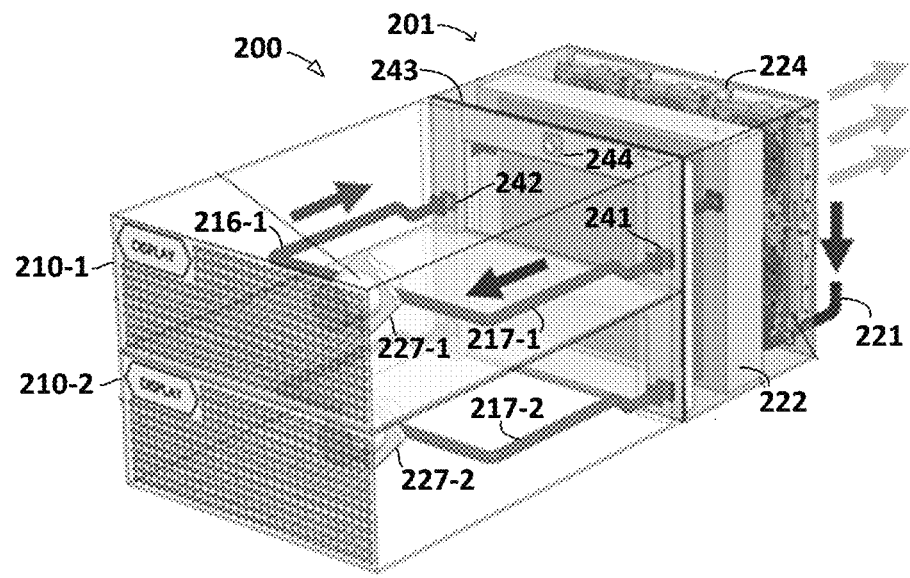
FIG. 4 illustrates a modular liquid-to-air cooling distribution unit in accordance with disclosed subject matter.

Turning now to FIG. 4, a modular and highly available liquid-to-air CDU 200, referred to herein simply as CDU 200, is illustrated. The CDU 200 illustrated in FIG. 4, features a first module 201, referred to herein as heat exchange module 201, and a redundant pair of pump modules 210-1 and 210-2. Heat exchange module 201 occupies a rearward portion of a designated rack space in which CDU 200 resides while the pair of redundant pump modules occupy a forward portion of the designated rack space. The heat exchange module 201 illustrated in FIG. 4 receives high temperature liquid coolant, referred to herein as hot coolant, from a CDU inlet 221 that is coupled to one or more information handling resources (not depicted in FIG. 4).

In at least one embodiment, one of the pump modules serves as the primary pump module while the other pump module 210 serves as the backup module. Either pump module 210 may serve as the primary pump module while the remaining pump module 210 serves as the backup pump module. For the sake of brevity and clarity, first pump module 210-1 is designated as the primary pump module for purposes of this disclosure while second pump module 210-2 is designated as the backup pump module.

Each redundant pump module 210 includes a circulation pump 227, an inlet coolant conduit 217, and an outlet coolant conduit 216. Inlet coolant conduit 217 is connected between an inlet port of circulating pump 227 and an inlet connector 241 on a back panel 243 of pump module 210. Outlet coolant conduit 216 is connected between an outlet port of circulating pump 227 and an outlet connector 242 on the back panel 243. Inlet connector 241 and outlet connector 242 provide fluidic connections to corresponding ports of heat exchanger 222.

In at least one embodiment, inlet connector 241 and outlet connector 242 are implemented as fluidic quick-disconnect connectors that facilitate tool-less servicing and hot swapping of pump modules 210. The back panel 243 illustrated in FIG. 4 further includes an electrical connector 244 configured to couple electrical signals between heat exchange module 201 and the pump module 210. In at least one embodiment, the electrical connector 244 is implemented as a quick-disconnect electrical connector that facilitates tool-less servicing and hot-swapping of pump modules 210.

When circulating pump 227 is activated, hot liquid coolant enters CDU 200 at CDU inlet 221, circulates through heat exchanger 222, where the hot coolant is transformed to cold coolant, and through the active pump module 210 to a CDU outlet (not depicted in FIG. 4) that is coupled to the information handling resources, which generate thermal energy that converts the cold coolant to hot coolant to complete the cycle.

Figure 5:
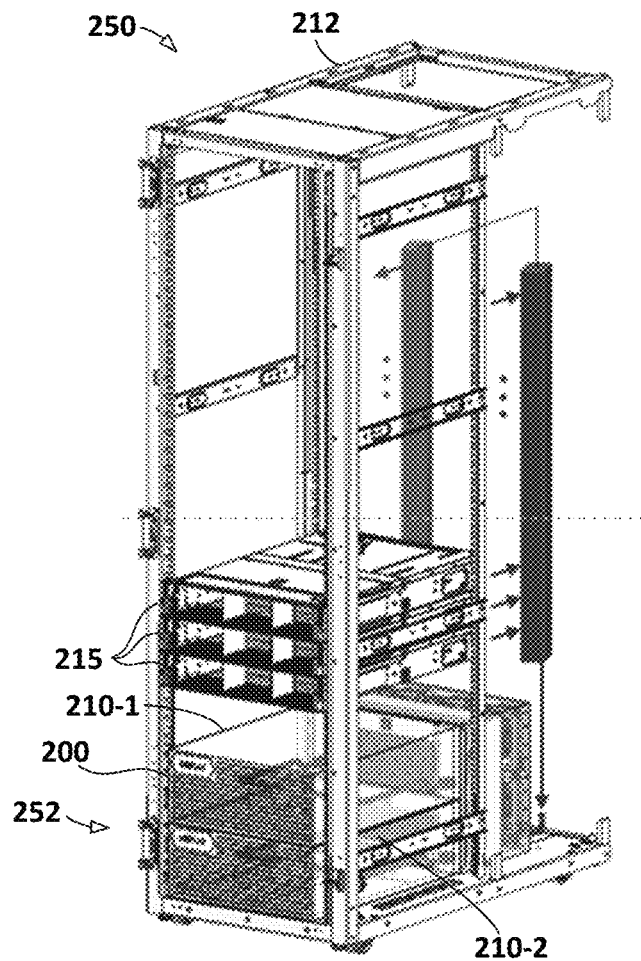
FIG. 5 illustrates a perspective view of a rack information handling system including a rack server and a modular liquid-to-air cooling distribution unit occupying a designated rack space within the rack server.

Referring now to FIG. 5, CDU 200 is illustrated as a component of a rack information handling system 250. The rack information handling system 250 illustrated in FIG. 5 includes a server rack 212 defining and supporting a plurality of 1U rack units. Rack information handling system 250 further includes one or more information handling resources 215, three of which are illustrated in FIG. 5. Each information handling resource 215 is sized to reside within a rack space defined by one or more of the 1U rack units. As illustrated in FIG. 5, CDU 200 is installed in a designated rack space 252 of rack information handling system 115. Those of ordinary skill in the field will appreciate that, even though the CDU 200 of FIG. 5 includes redundant pump modules 210, the designated rack space 252 is equivalent in size to the rack space occupied by the standalone CDU 20 illustrated in FIG. 1.

Figure 6:
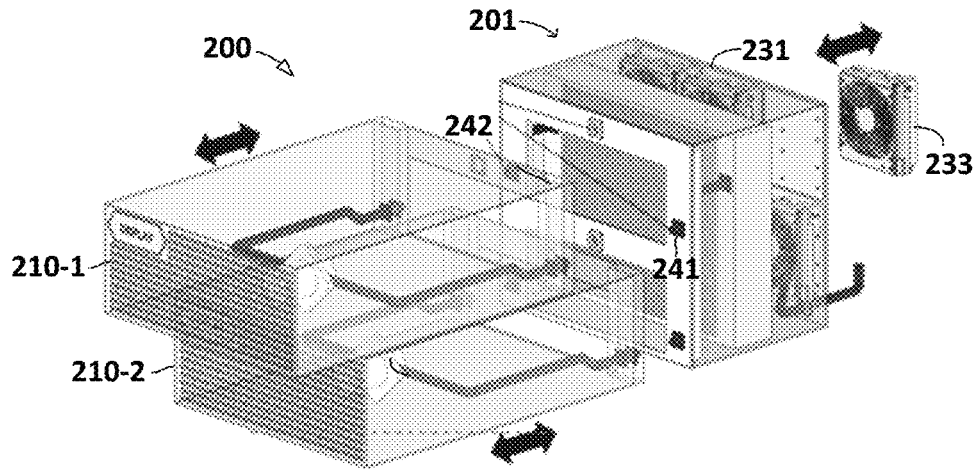
FIG. 6 illustrates a perspective view of the modular liquid-to-air cooling distribution unit revealing hot serviceable pump modules and a hot serviceable fan.

Referring now to FIG. 6, redundancy features of CDU 200 are illustrated. As depicted in FIG. 6, either pump module 210 can be quickly and tool-lessly hot swapped, i.e., connected or disconnected from the heat exchange module 201 via fluidic quick disconnects 241 and 242 without interrupting the function of the applicable information handling resources. The pumps modules are configured to communicate with a controller such that, if a first pump module 210-1 fails or is disconnected, the second pump module is automatically configured as the primary/active pump. FIG. 6 further illustrates fan assembly 231 configured with N+1 redundancy and a hot swappable redundant fan 233.

FIG. 6 also illustrates the redundant pump modules positioned with first pump module 210-1 overlying second module 210-2 and wherein the CDU 200 is configured to occupy a designated rack space of N rack units, where N is an integer greater than 1. In this configuration, each pump module 210 is N/2 rack units in vertical dimension. Thus, for example, if CDU 200 is occupies a designated rack space of 4 rack units (4U), each pump module 210 has a 2U vertical dimension. In another embodiment, not depicted, the pump modules 210 may be implemented side-by-side wherein each pump module is N rack units in vertical dimension, but has a width that is half the width of the server rack.

Figure 7:
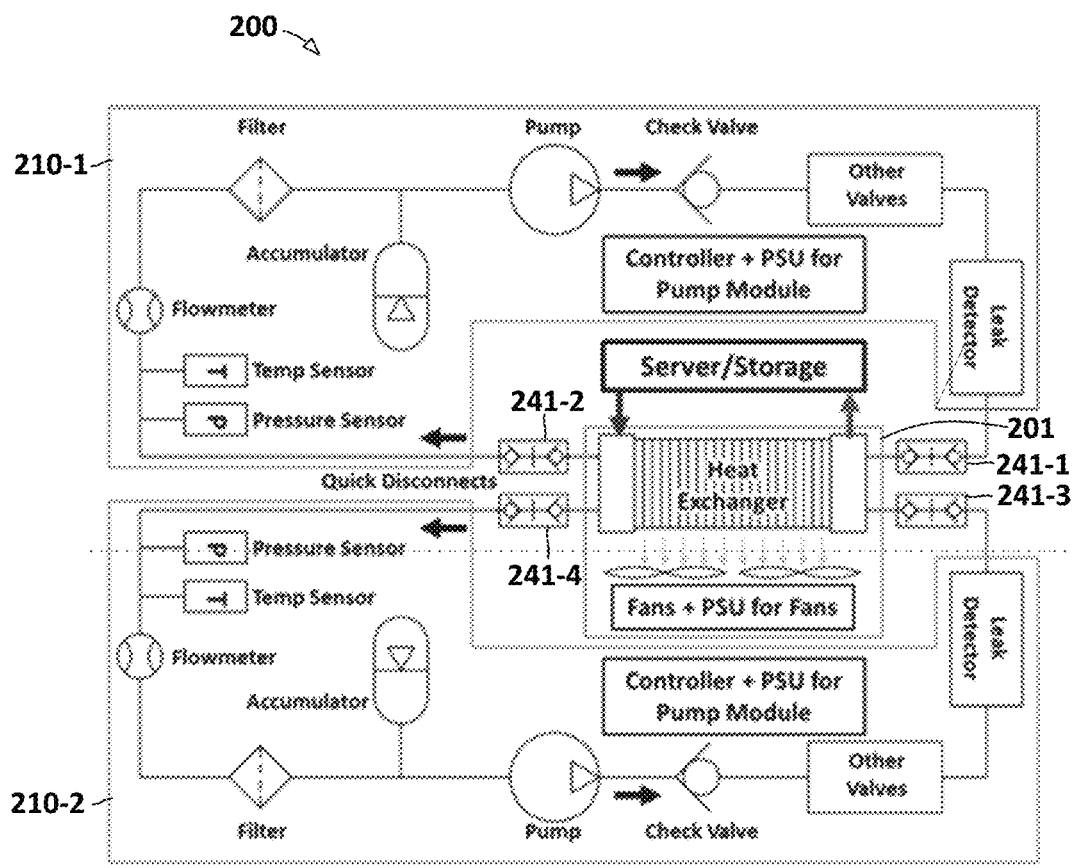
FIG. 7 illustrates a block diagram of a modular liquid-to-air cooling distribution unit.

FIG. 7 illustrates a block diagram of CDU 200 including the heat exchange module 201 and the redundant pair of pump modules 210-1 and 210-2, each of which includes components analogous to the components of the CDU 20 illustrated in FIG. 3. FIG. 7 also illustrate quick disconnects 241 including a first pair of disconnects 241-1 and 241-2, connecting heat exchanger 222 and first pump module 210-1, and a second pair of disconnects 241-3 and 241-4, connecting heat exchanger 2220 to second pump module 210-2.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A liquid-to-air cooling distribution unit for a rack information handling system, wherein the cooling distribution unit comprises:
   a heat exchange module configured to occupy a first region of a designated rack space, wherein the heat exchange module is fluidically coupled to one or more rack information handling resources and, wherein the heat exchange module includes:
      a heat exchanger to dissipate heat from a liquid coolant; and
      a fan assembly to move heated air in proximity to the heat exchanger;
   a pair of redundant pump modules coupled to the heat exchange module and configured to occupy a second region of the designated rack space, wherein the pair of redundant pump modules include a first pump module and a second pump module, where each pump module is configured to circulate liquid coolant through the heat exchanger;
   fluidic quick disconnects providing tool-less fluidic connections between liquid coolant conduits and the heat exchange module; and
   electrical quick disconnects providing tool-less electrical connections between the heat exchange module and each pump module.

2. The cooling distribution unit of claim 1, wherein the heat exchanger is configured to:
   receive heated coolant from an inlet manifold fluidically coupled to one or more rack information handling resources; and
   provide cooled coolant to an outlet manifold fluidically coupled to the one or more information handling resources.

3. The cooling distribution unit of claim 1, wherein the fan assembly includes a plurality of fans configured to move air away from the heat exchanger.

4. The cooling distribution unit of claim 3, wherein the plurality of fans are configured with N+1 redundancy.

5. The cooling distribution unit of claim 1, wherein each pump module includes a circulating pump, a first liquid coolant conduit connected to a first port of the circulating pump and a second liquid coolant conduit connected to a second port of the circulating pump.

6. The cooling distribution unit of claim 1, wherein each of the pump modules is hot serviceable.

7. A rack information handling system, comprising:
a server rack defining a plurality of 1U rack units suitable for receiving one or more information handling resources; and
a cooling distribution unit, wherein the cooling distribution unit comprises:
a heat exchange module configured to occupy a first portion of a designated rack space within the server rack, wherein the heat exchange module is fluidically coupled to one or more rack information handling resources and, wherein the heat exchange module includes:
a heat exchanger to dissipate heat from a liquid coolant; and
a fan assembly to move heated air in proximity to the heat exchanger;
a pair of redundant pump modules coupled to the heat exchange module and configured to occupy a second region of the designated rack space, wherein the pair of redundant pump modules include a first pump module and a second pump module, where each pump module is configured to circulate liquid coolant through the heat exchanger;
fluidic quick disconnects providing tool-less fluidic connections between liquid coolant conduits and the heat exchange module; and
electrical quick disconnects providing tool-less electrical connections between the heat exchange module and each pump module.

8. The rack information handling system of claim 7, wherein the heat exchanger is configured to:
receive heated coolant from an inlet manifold fluidically coupled to one or more rack information handling resources; and
provide cooled coolant to an outlet manifold fluidically coupled to the one or more information handling resources.

9. The rack information handling system of claim 7, wherein the fan assembly includes a plurality of fans configured to move air away from the heat exchanger.

10. The rack information handling system of claim 9, wherein the plurality of fans are configured with N+1 redundancy.

11. The rack information handling system of claim 7, wherein each pump module includes a circulating pump, a first liquid coolant conduit connected to a first port of the circulating pump and a second liquid coolant conduit connected to a second port of the circulating pump.

12. The rack information handling system of claim 7, wherein each of the pump modules is hot serviceable.

13. The rack information handling system of claim 7, wherein:
the rack information handling system includes a server rack defining a plurality of 1U rack units;
the designated rack space comprises N 1U rack units, wherein N is an integer greater than 1;
the heat exchange module is configured to occupy a forward portion of the N adjacent 1U rack units; and
each pump module is configured to occupy one half of a reward portion of the N adjacent 1U rack units.

14. The rack information handling system of claim 13, wherein the pair of redundant pump modules are arranged with the first pump module over the second pump module, wherein each of the pump module has a vertical dimension of N/2 1U rack units.

15. The rack information handling system of claim 13, wherein the pair of redundant pump modules are arranged with the first pump module alongside the second pump module, wherein each of the pump module has a vertical dimension of N 1U rack units.

16. A liquid-to-air cooling distribution unit for a rack information handling system, wherein the cooling distribution unit comprises:
a heat exchange module configured to occupy a first region of a designated rack space, wherein the heat exchange module is fluidically coupled to one or more rack information handling resources and, wherein the heat exchange module includes:
a heat exchanger to dissipate heat from a liquid coolant; and
a fan assembly to move heated air in proximity to the heat exchanger; and
a pair of redundant pump modules coupled to the heat exchange module and configured to occupy a second region of the designated rack space, wherein the pair of redundant pump modules include a first pump module and a second pump module, where each pump module is configured to circulate liquid coolant through the heat exchanger, wherein:
the rack information handling system includes a server rack defining a plurality of 1U rack units;
the designated rack space comprises N 1U rack units, wherein N is an integer greater than 1;
the heat exchange module is configured to occupy a forward portion of the N adjacent 1U rack units; and
each pump module is configured to occupy one half of a reward portion of the N adjacent 1U rack units.

17. The cooling distribution unit of claim 16, wherein the pair of redundant pump modules are arranged with the first pump module over the second pump module, wherein each of the pump module has a vertical dimension of N/2 1U rack units.

18. The cooling distribution unit of claim 16, wherein the pair of redundant pump modules are arranged with the first pump module alongside the second pump module, wherein each of the pump module has a vertical dimension of N 1U rack units.

* * * * *